United States Patent
Choi et al.

(10) Patent No.: US 7,488,936 B2
(45) Date of Patent: Feb. 10, 2009

(54) TFT ARRAY INSPECTING APPARATUS

(75) Inventors: Ho Seok Choi, Suwon-si (KR); Vasily Lenyashine, Suwon-Si (KR); Hyeong Min Ahn, Yongin-Si (KR); Jeong Su Ha, Suwon-Si (KR); Sergey Antonov, Suwon-Si (KR); Mi Jeong Song, Suwon-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 244 days.

(21) Appl. No.: 11/188,719

(22) Filed: Jul. 26, 2005

(65) Prior Publication Data

US 2006/0163475 A1    Jul. 27, 2006

(30) Foreign Application Priority Data

Jan. 24, 2005    (KR) .................. 10-2005-0006443

(51) Int. Cl.
*G21K 7/00* (2006.01)
(52) U.S. Cl. .................. 250/310; 250/397; 250/305; 250/306; 250/311; 324/770
(58) Field of Classification Search .................. 250/310, 250/397, 305, 306, 311, 442.11; 324/770, 324/750–753, 501
See application file for complete search history.

(56) References Cited

U.S. PATENT DOCUMENTS

| | | | | |
|---|---|---|---|---|
| 5,214,282 A * | 5/1993 | Yamaguchi et al. ......... 250/307 |
| 5,333,495 A * | 8/1994 | Yamaguchi et al. ........... 73/105 |
| 5,459,594 A * | 10/1995 | Nakanishi et al. ........... 349/187 |
| 6,075,245 A * | 6/2000 | Toro-Lira .................... 250/310 |
| 6,403,968 B1 * | 6/2002 | Hazaki et al. .......... 250/442.11 |
| 6,740,894 B1 * | 5/2004 | Mitchell ................. 250/492.21 |
| 7,157,921 B2 * | 1/2007 | Shonohara .................. 324/751 |
| 7,164,128 B2 * | 1/2007 | Miyamoto et al. .......... 250/311 |
| 7,362,123 B2 * | 4/2008 | Choi et al. .................. 324/770 |
| 2004/0012742 A1 * | 1/2004 | Ohnishi ..................... 349/123 |
| 2004/0174182 A1 * | 9/2004 | Toro-Lira et al. ........... 324/770 |
| 2004/0223140 A1 * | 11/2004 | Shonohara ............... 356/237.1 |
| 2005/0040346 A1 * | 2/2005 | Lee et al. ............... 250/492.21 |
| 2005/0174140 A1 * | 8/2005 | Iwasaki ....................... 324/770 |
| 2006/0103416 A1 * | 5/2006 | Miyatake et al. ............ 324/770 |
| 2006/0181290 A1 * | 8/2006 | Brunner ...................... 324/751 |

\* cited by examiner

*Primary Examiner*—David A. Vanore
*Assistant Examiner*—Michael Logie
(74) *Attorney, Agent, or Firm*—Stanzione & Kim, LLP

(57) ABSTRACT

A TFT array inspecting apparatus inspects a TFT array disposed at either an inclined position and a level position. The TFT array inspecting apparatus includes a vacuum chamber, a stage disposed in the vacuum chamber so that a TFT array to be inspected is disposed on the stage, an electron gun disposed opposite to the stage in the vacuum chamber to generate an electron beam onto the TFT array, an electron detecting unit to detect secondary electrons emitted from the TFT array by the electron gun, and at least one elevating unit to move the TFT array move between a level position and an inclined position having a designated angle with the level position.

22 Claims, 3 Drawing Sheets

TFT ARRAY INSPECTING APPARATUS

CROSS-REFERENCE TO RELATED APPLICATIONS

This application claims the benefit of Korean Patent Application No. 2005-6443, filed Jan. 24, 2005, in the Korean Intellectual Property Office, the disclosure of which is incorporated herein by reference.

BACKGROUND OF THE INVENTION

1. Field of the Invention

The present general inventive concept relates to a thin film transistor (TFT) array inspecting apparatus, and more particularly, to a TFT array inspecting apparatus which inspects a TFT array disposed at an inclined position so that TFT arrays having different sizes are continuously inspected, and allows an electron detecting unit to be disposed close to the TFT array so that secondary electron detecting performance is improved.

2. Description of the Related Art

A thin film transistor liquid crystal display (TFT-LCD), which is a type of a flat display panel device, is a device for displaying data using characteristics of liquid crystal, in which transmittancy of light is changed according to a voltage, is operable at a low voltage, and has a low power consumption rate, thereby being increasingly used in office automation (OA) equipment and household electric appliances.

Generally, the above TFT-LCD comprises a lower glass substrate on which arrays of TFTs serving as individual switching elements are installed, an upper glass substrate on which three color filters, i.e., red, green, and blue filters, are formed, a liquid crystal injected into a space between the lower glass substrate and the upper glass substrate, and a back light for supplying light emitted from an area below the lower glass substrate. The TFT-LCD varies a molecular structure according to electrical signals of the TFTs and a voltage applied to an LCD, and controls a degree of transmittance of the light. Then, the TFT-LCD causes the controlled light to pass through the three color filters, thus displaying desired color and image.

The above TFT-LCD is manufactured through an array manufacturing process in which the TFTs are formed, a cell manufacturing process in which the liquid crystal between a TFT array substrate (lower glass substrate) and a color filter substrate (upper glass substrate) is sealed, and a module manufacturing process in which an electric circuit for driving a TFT array substrate and a cell substrate is mounted.

After the TFT array is manufactured, it is inspected to determine whether or not the TFT array is defective. U.S. Pat. No. 6,075,245 discloses a TFT array inspecting apparatus.

The above TFT array inspecting apparatus comprises a CRT gun installed at an upper part of a vacuum chamber for emitting electron beam, a vacuum pump installed under the vacuum chamber for vacuuming an inside of the vacuum chamber, and an electric detector installed at one side of the vacuum chamber for detecting electrons emitted from a TFT array using the electron beam to inspect the TFT array disposed in the vacuum chamber.

The above conventional TFT array inspecting apparatus has a limitation in inspecting TFT arrays having various sizes in a single vacuum chamber. That is, a projection range of the CRT gun is set to a predetermined value according to the TFT array having a designated size, the TFT array inspecting apparatus cannot inspect TFT arrays having sizes larger than the set projection range of the CRT gun.

Accordingly, in order to inspect TFT arrays having sizes lager than the set projection range of the CRT gun, the projection range of the CRT gun is reset, and then the inside of the vacuum chamber is again vacuumed to a required vacuum degree. Thus, inspection of the TFT arrays having various sizes in a single chamber has a complicated procedure and requires a long period of time for preparing the complicated procedure.

SUMMARY OF THE INVENTION

In order to solve the foregoing and/or other problems, the present general inventive concept provides a TFT array inspecting apparatus which inspects a TFT array located at either an inclined position or a level position.

The present general inventive concept provides a TFT array inspecting apparatus which detects secondary electrons when an electron detecting unit is located adjacent to a TFT array to be inspected.

Additional aspects and advantages of the present general inventive concept will be set forth in part in the description which follows and, in part, will be obvious from the description, or may be learned by practice of the general inventive concept.

The foregoing and/or other aspects and advantages of the present general inventive concept may be achieved by providing a TFT array inspecting apparatus comprising a vacuum chamber, a stage disposed in the vacuum chamber so that a TFT array to be inspected is disposed on the stage, an electron gun disposed opposite to the stage in the vacuum chamber to generate an electron beam onto the TFT array, an electron detecting unit to detect secondary electrons emitted from the TFT array by the electron gun, and at least one elevating unit to move the TFT array at a designated angle between a level position and an inclined position.

The electron gun may be disposed above the vacuum chamber, the stage may be disposed at a lower part of the vacuum chamber, and the elevating unit may be disposed at a first end of the stage.

A stopper protruding upwardly may be provided at a second end of the stage, and the TFT array is moved to the inclined position by lifting a first end of the TFT array using the elevating unit while a second end of the TFT array is caught by the stopper.

The elevating unit may be a hydraulic cylinder type.

The electron detecting unit may vertically be installed above the stopper to detect the secondary electrons emitted from the TFT array.

A lens unit to set an irradiating position of the electron beam and a deflection unit to deflect the electron beam passing through the lens unit are disposed in front of the electron gun.

The foregoing and/or other aspects and advantages of the present general inventive concept may also be achieved by providing a TFT array inspecting apparatus comprising a vacuum chamber vacuumed by a vacuum pump, an electron gun to generate an electron beam onto a TFT array disposed in the vacuum chamber, an electron detecting unit to detect secondary electrons emitted from the TFT array by the electron beam, and at least one elevating unit to move the TFT array between a level position and an inclined position having a designated angle with the level position.

The electron gun may be disposed above the vacuum chamber, the TFT array may be disposed at a lower part of the vacuum chamber, and the elevating unit may be disposed at a first end of the TFT array to elevate the end of the TFT array.

The electron detecting unit is vertically installed above a second end of the TFT array to detect the secondary electrons emitted from the TFT array.

BRIEF DESCRIPTION OF THE DRAWINGS

These and/or other aspects and advantages of the general inventive concept will become apparent and more readily appreciated from the following description of the embodiments, taken in conjunction with the accompanying drawings in which.

DETAILED DESCRIPTION OF THE PREFERRED EMBODIMENTS

Figure 1:
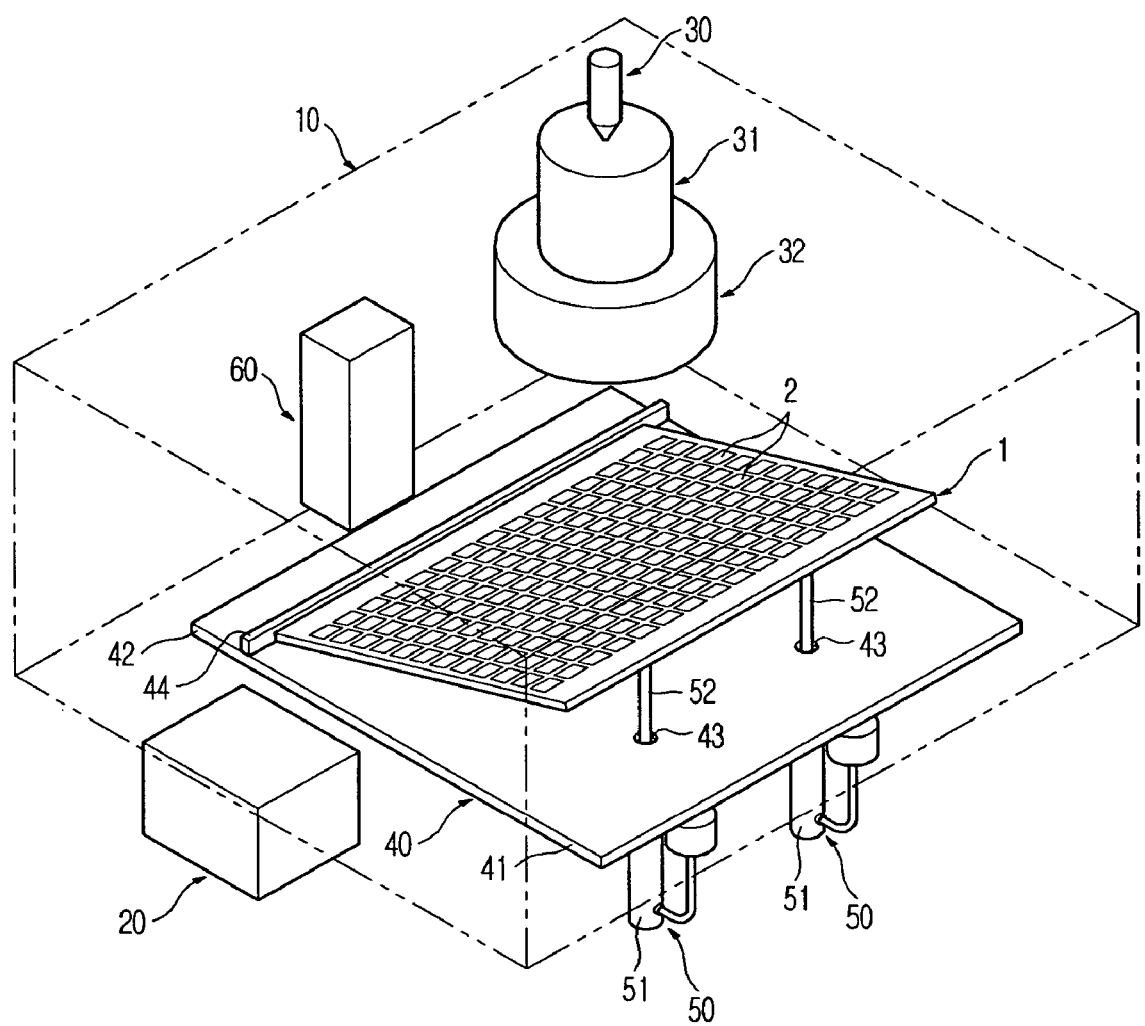
FIG. 1 is a schematic block diagram illustrating a TFT array inspecting apparatus according to an embodiment of the present general inventive concept.

Reference will now be made in detail to the embodiment of the present general inventive concept, an example of which is illustrated in the accompanying drawings, wherein like reference numerals refer to like elements throughout. The embodiment is described below to explain the present invention by referring to the annexed drawings.

FIG. 1 is a schematic block diagram illustrating a TFT array inspecting apparatus according to an embodiment of the present general inventive concept. As shown in FIG. 1, the TFT array inspecting apparatus comprises a vacuum chamber 10, a vacuum pump 20 installed under the vacuum chamber 10 to vacuum an inside of the vacuum chamber 10, an electron gun 30 disposed above the vacuum chamber 10, a lens unit 31 and a deflection unit 32 disposed in front of the electron gun 30, a stage 40 installed on a bottom surface of the inside of the vacuum chamber 10 to mount a TFT array 1 thereon to be inspected, a pair of elevating units 50 installed under the vacuum chamber 10, and an electron detecting unit 60 disposed at one side of the vacuum chamber 10.

The electron gun 30 has a structure which generates an electron beam 33 (with reference to FIG. 2) having a high energy level to inspect whether or not the TFT array 1 is defective in a vacuum state, and the lens unit 31 has a structure which adjusts a direction and an intensity of the electron beam 33 emitted from the electron gun 30. Further, the deflection unit 32 installed in front of the lens unit 31 has a structure which deflects the electron beam 33, passing through the lens unit 31, towards respective pixels 2 of the TFT array 1 so that an overall surface of the TFT array 1 to be inspected is continuously scanned.

The stage 40 has a flat shape with a size lager than that of the TFT array 1 to mount the TFT array 1 thereon in the vacuum chamber 10, and is disposed on the bottom of the vacuum chamber 10.

Each of the pair of the elevating units 50 includes a hydraulic cylinder having a main body 51 and a piston rod 52 vertically moving along the main body 51. The elevating units 50 are vertically disposed on a lower surface of a first end 41 of the stage 40, and vertically move a first end of the TFT array 1.

Although FIG. 1 illustrates two elevating units 50 in a pair, the number of the elevating units 50 may be increased or decreased according to the size of the TFT array 1 to be inspected. For example, in a case that the TFT array 1 has a small size, only one elevating unit 50 may be prepared, and in a case that the TFT array 1 has a large size, at least three elevating units 50 may be prepared.

The main bodies 51 of the elevating units 50 may be disposed below an outside of the vacuum chamber 10, and the piston rods 52 of the elevating units 50 may vertically move between insides of the main bodies 51 and the inside of the vacuum chamber 10.

In order to allow the piston rods 52 of the elevating units 50 to vertically move the TFT array 1 disposed on an upper surface of the stage 40, a pair of through holes 43 through which the piston rods 52 of the elevating units 50 pass are formed on the first end 41 of the stage 40.

In order to fix the second end of the TFT array 1 without a movement when the piston rods 52 lift the first end of the TFT array 1, a stopper 44 extended from the upper surface of the stage 40 is installed at a second end 42 of the stage 40. Accordingly, when the piston rods 52 move upwardly or downwardly, the first end of the TFT array 1 is elevated upwardly or lowered downwardly under a condition that a second end of the TFT array 1 contacting the stopper 44 is fixed to the stage 40. Thereby, it is possible to move the TFT array 1 from a level position to an inclined position, from the inclined position to the level position, or a position between the level position and the inclined position.

Although FIG. 1 illustrates a length of the stopper 44 is the same as a longitudinal length of the stage 40, the stopper 44 may be extended from both end of the stage 40 such that the length of the stopper 44 is larger than the longitudinal length of the stage 40 so long as the TFT array 1 is fixed to the stopper 44.

The electron detecting unit 60 is disposed above the stopper 44 such that the electron detecting unit 60 is approximately vertical to the surface of the stage 40, and detects electrons emitted from the TFT array 1 using the electron beam 33 when the TFT array 1 is disposed at the level position or the most inclined position. The electron beam 33 emitted from the electron gun 30 may be a primary electron, and the electron emitted from the TFT array 1 in response to the electron beam 33 may be a secondary electron.

Hereinafter, a process of inspecting a TFT array disposed at an inclined position using the above TFT array inspecting apparatus of FIG. 1 according to an embodiment of the present general inventive concept will be described.

Figure 2:
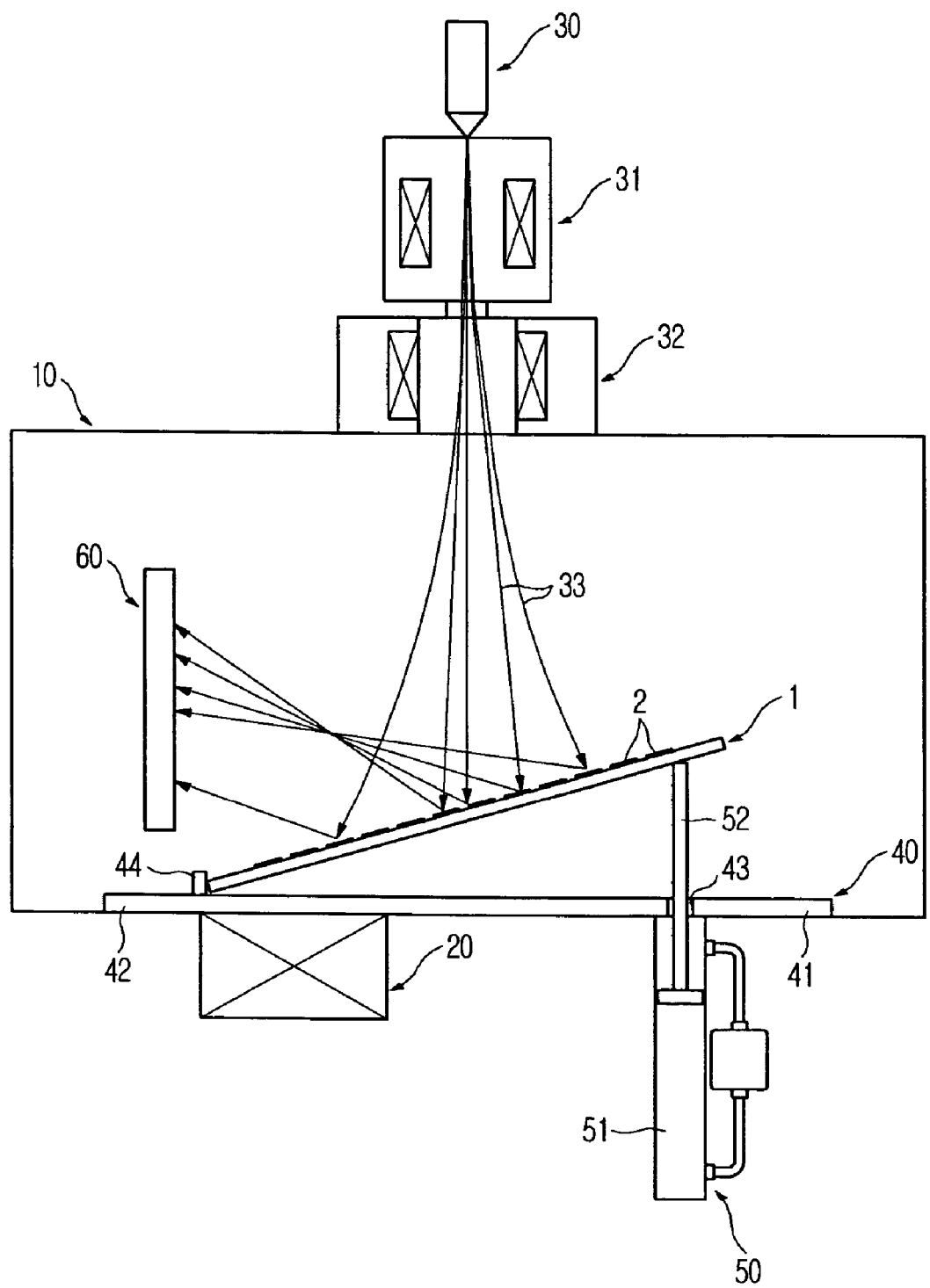
FIG. 2 is a front view illustrating a state in which an electron beam emitted from an electron gun collides with pixels of a TFT array so that secondary electrons are transmitted to an electron detecting unit in the TFT array inspecting apparatus of FIG. 1.

As shown in FIG. 2, when the TFT array 1 having a size, which can not be inspected at its level position by the electron beam 33 emitted by the electron gun 30 through the lens unit 31 and the deflection unit 32, is disposed on the stage 40 in the vacuum chamber 10, the elevating units 50 are operated to lift the first end of the TFT array 1 to the inclined angle such that the electron beam 30 emitted from the electron gun 33 is irradiated onto an overall inspected area of the TFT array 1.

Thereafter, when the electron beam 33 is emitted from the electron gun 30 and passes through the lens unit 31, the direction and the intensity of the electron beam 33 are adjusted. Then, when the electron beam 33 passes through the deflection unit 32, the electron beam 33 is deflected and is irradiated sequentially onto the pixels 2 of the TFT array 1, thereby scanning the TFT array 1.

When the electron beam 33 collides with the pixels 2, the secondary electrons are generated from the pixels 2 and transmitted to the electron detecting unit 60. The electron detecting unit 60 measures a route and the intensity of the electron beam 33 moving to the pixels 2 and an intensity of the secondary electrons transmitted from the pixels 2, thereby detecting whether or not the TFT array 1 defective.

Accordingly, since the electron detecting unit 60 detecting the secondary electrons generated from the TFT array 1 is located at a position close to the TFT array 1, the electron detecting unit 60 has an improved detection performance. The electron gun 30 of the TFT array inspecting apparatus is vertically disposed above the first end of the TFT array 1, and the TFT array inspecting apparatus inspects the TFT array 1 disposed at the inclined position toward the electron detecting unit 60, thus allowing the electron detecting unit 60 to precisely detect the intensity of the secondary electrons.

Hereinafter, it will be described that a TFT array having a comparatively large size is inspected when the TFT array is inspected when the TFT array is disposed at an inclined position having an angle with a level position.

Figure 3:
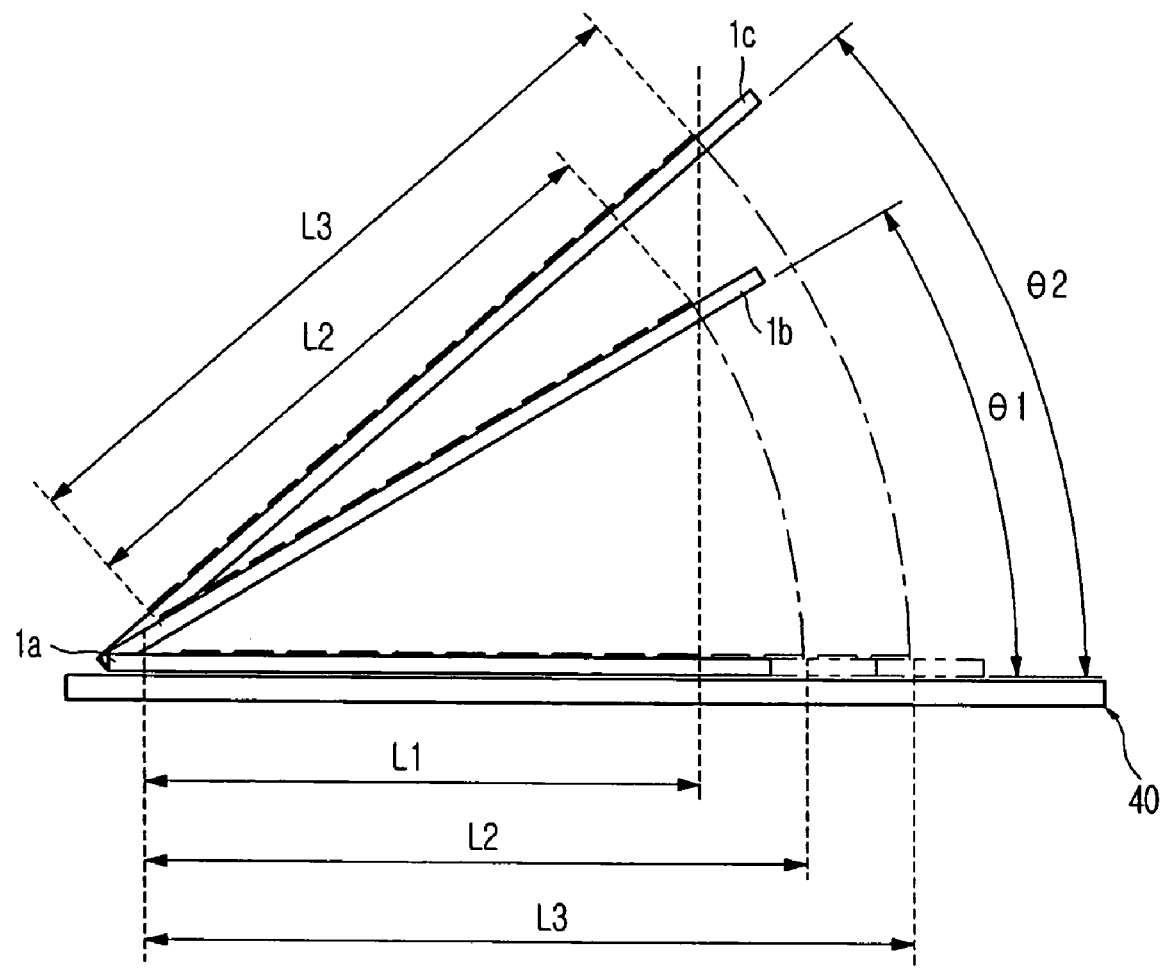
FIG. 3 is a view illustrating areas of TFT arrays disposed at positions between an inclined position and a level position.

As shown in FIGS. 1-3, when a first TFT array 1a having a first inspection length the same as or smaller than an effective inspection length (L1) of the TFT array inspecting apparatus of the present general inventive concept is inspected, the first TFT array 1a is inspected when the TFT array 1a is disposed at a level position on the stage 40 in the same manner as a conventional TFT array.

When a second TFT array 1b having a second inspection length (L2) larger than the effective inspection length (L1) of the TFT array inspecting apparatus of the present general inventive concept is disposed in the vacuum chamber 10 after the inspection of the first TFT array 1a is completed, the elevating units 50 lift a first end of the second TFT array 1b to a designated angle ($\theta 1$). Thereby, the second inspection length (L2) of the TFT array 1b at the inclined position is within a range of the effective inspection length (L1).

When the second TFT array 1b inclined at the angle ($\theta 1$) is inspected, it is possible to inspect the second TFT array 1b having the second inspection length (L2) larger than the effective inspection length (L1).

When a third TFT array 1c having a third inspection length (L3) larger than the second inspection length (L2) of the second TFT array 1b is disposed in the vacuum chamber 10, the elevating units 50 lift a first end of the third TFT array 1c to a designated angle ($\theta 2$) higher than the angle ($\theta 1$) of the second TFT array 1b so that the third inspection length (L3) of the third TFT array 1c at the inclined position is in the range of the effective inspection length (L1). Accordingly, it is possible to inspect the third TFT array 1c having the third inspection length (L3) larger than the inspection lengths (L1) and (L2) of the first and second TFT arrays 1a and 1b.

As described above, the TFT array inspecting apparatus of the present general inventive concept inspects whether or not the first, second, and third TFT arrays 1a, 1b, and 1c having different sizes are defective by simply moving the first, second, and third TFT arrays 1a, 1b, and 1c to a position between the level position and the inclined position.

Accordingly, in a case that the TFT arrays have slightly different sizes, the TFT array inspecting apparatus of the present general inventive concept rapidly and simply inspects whether or not these TFT arrays are defective.

As apparent from the above description, the present general inventive concept provides a TFT array inspecting apparatus which inspects whether or not a TFT array disposed at either an inclined position or a level position is defective, thereby being capable of rapidly and simply inspecting TFT arrays having different sizes in a single vacuum chamber.

Further, the TFT array inspecting apparatus of the present general inventive concept comprises an electron detecting unit to detect secondary electrons when the electron detecting unit is located close to the TFT array, thereby improving a secondary electron-detecting performance and precisely inspecting a failure of the TFT array.

Although an embodiment of the general inventive concept has been shown and described, it would be appreciated by those skilled in the art that changes may be made in this embodiment without departing from the principles and spirit of the general inventive concept, the scope of which is defined in the claims and their equivalents.

What is claimed is:

1. A TFT array inspecting apparatus comprising:
   a vacuum chamber;
   a stage disposed in the vacuum chamber so that a TFT array to be inspected is disposed on the stage;
   an electron gun opposite to the stage in the vacuum chamber to generate an electron beam onto the TFT array;
   an electron detecting unit to detect secondary electrons emitted from the TFT array in response to the electron beam of the electron gun; and
   at least one elevating unit to move the TFT array to a position between a level position and an inclined position having a designated angle with the level position, the position varying according to a size of the TFT array.

2. The TFT array inspecting apparatus as set forth in claim 1, wherein the electron gun is disposed above the vacuum chamber, the stage is disposed at a lower part of the vacuum chamber, and the elevating unit is disposed at a first end of the stage.

3. The TFT array inspecting apparatus as set forth in claim 2, further comprising:
   a stopper provided at a second end of the stage to protrude upward,
   wherein the TFT array is moved into the inclined position when a first end of the TFT array is lifted by the elevating unit while a second end of the TFT array is caught by the stopper.

4. The TFT array inspecting apparatus as set forth in claim 3, wherein the electron detecting unit is vertically installed above the stopper to detect the secondary electrons emitted from the TFT array.

5. The TFT array inspecting apparatus as set forth in claim 1, wherein the elevating unit is a hydraulic cylinder type.

6. The TFT array inspecting apparatus as set forth in claim 1, further comprising:
   a lens unit to set an irradiating position of the electron beam; and
   a deflection unit disposed in front of the electron gun to deflect the electron beam passing through the lens unit.

7. A TFT array inspecting apparatus comprising:
   a vacuum chamber vacuumed by a vacuum pump;
   an electron gun to generate an electron beam onto a TFT array disposed in the vacuum chamber;
   an electron detecting unit to detect secondary electrons emitted from the TFT array in response to the electron beam of the electron beam; and
   at least one elevating unit to move the TFT array to a position between a level position and an inclined position having a designated angle with the level position, the position varying according to a size of the TFT array.

8. The TFT array inspecting apparatus as set forth in claim 7, wherein the electron gun is disposed above the vacuum chamber, the TFT array is disposed at a lower part of the vacuum chamber, and the elevating unit is disposed at a first end of the TFT array to elevate an end of the TFT array.

9. The TFT array inspecting apparatus as set forth in claim 8, wherein the electron detecting unit is vertically installed above a second end of the TFT array to detect the secondary electrons emitted from the TFT array.

10. The TFT array inspecting apparatus as set forth in claim 7, further comprising:
  a lens unit to set an irradiating position of the electron beam; and
  a deflection unit disposed in front of the electron gun to deflect the electron beam passing through the lens unit.

11. A transistor array inspecting apparatus comprising:
  a vacuum chamber;
  an electron gun to generate an electron beam onto a transistor array disposed in the vacuum chamber;
  an electron detecting unit to detect secondary electrons emitted from the transistor array in response to the electron beam of the electron beam; and
  at least one elevating unit to change a relative position between the transistor array and at least one of the electron gun and the electron detecting unit, the position varying according to a size of the transistor array, so that it is determined whether the transistor array is defective according to the detected secondary electrons.

12. The transistor array inspecting apparatus as set forth in claim 11, wherein the vacuum chamber comprises a bottom, and the at least one elevating unit comprises:
  a main body; and
  a piston rod connected to the main body to elevate the transistor array with respect to the bottom.

13. The transistor array inspecting apparatus as set forth in claim 12, wherein the main body is disposed outside the vacuum chamber, and the piston rod passes through a hole formed on the bottom of the vacuum chamber to elevate the transistor array.

14. The transistor array inspecting apparatus as set forth in claim 12, further comprising:
  a stopper disposed in the vacuum chamber,
    wherein the piston rod elevates a first end of the transistor array, and the stopper supports a second end of the transistor.

15. The transistor array inspecting apparatus as set forth in claim 11, further comprising:
  a stage on which the transistor array is disposed within the vacuum chamber,
    wherein the at least one elevating unit elevates the transistor array with respect to the stage.

16. The transistor array inspecting apparatus as set forth in claim 11, wherein the vacuum chamber comprises a bottom, and the electron gun and the electron detecting unit are fixedly connected to the vacuum chamber while the at least one elevating unit controls the transistor array to rotate with respect to the bottom according to the relative position.

17. The transistor array inspecting apparatus as set forth in claim 11, wherein the vacuum chamber comprises a bottom, and the at least one elevating unit controls the transistor array to move to a position having an angle with the bottom according to the relative position.

18. The transistor array inspecting apparatus as set forth in claim 11, wherein the transistor array has one of a first surface area and a second surface area to receive the electron beam and emit the secondary electrons, and the at least one elevating unit controls the transistor array to move to the relative position so that the second surface area has the same effective area as the first surface area with respect to a bottom of the vacuum chamber to correspond to the electron gun and the electron detecting unit.

19. The transistor array inspecting apparatus as set forth in claim 11, wherein the transistor array comprises a first transistor array having a first surface area and a second transistor array having a second surface area larger than the first surface area, and the at least one elevating unit controls the first transistor array to be disposed in a level position and the second transistor array to move an inclined position having an angle with the level position so that the first surface area of the first transistor array and the second surface of the second transistor array have a same effective area with respect to the electron gun and the electron detecting unit.

20. The transistor array inspecting apparatus as set forth in claim 11, wherein the transistor array comprises a first transistor array having a first surface area and a second transistor array having a second surface area larger than the first surface area, and the first surface area of the first transistor array and the second surface of the second transistor array are irradiated by the electron gun using the electron beam and detected by the electron detecting unit using the secondary electrons according to the relative position.

21. The transistor array inspecting apparatus as set forth in claim 11, wherein the at least one elevating unit moves the transistor array with respect to the electron gun and the electron detecting unit according to the relative position to inspect the transistor array regardless of an area of a surface of the transistor array to be inspected.

22. A TFT array inspecting apparatus comprising:
  a vacuum chamber;
  a stage disposed in the vacuum chamber so that one of a first TFT array and a second TFT to be inspected is disposed on the stage;
  an electron gun opposite to the stage in the vacuum chamber to generate an electron beam onto the one of the first TFT array and the second TFT array;
  an electron detecting unit to detect secondary electrons emitted from the one of the first TFT array and the second TFT array in response to the electron beam of the electron gun; and
  at least one elevating unit to move the stage to a first position and a second position with respect to a level position according to a first length of the first TFT array and a second length of the second TFT array such that the first TFT array and the second TFT array disposed on the stage at the first position and the second position, respectively, have a same effective length with respect to the level position.

* * * * *